United States Patent
Nara et al.

(10) Patent No.: US 6,340,883 B1
(45) Date of Patent: Jan. 22, 2002

(54) WIDE BAND IQ SPLITTING APPARATUS AND CALIBRATION METHOD THEREFOR WITH BALANCED AMPLITUDE AND PHASE BETWEEN I AND Q

(75) Inventors: Akira Nara; Hideaki Koyota, both of Tokyo (JP)

(73) Assignee: Sony/Tektronik Corporation, Tokyo (JP)

( * ) Notice: Subject to any disclaimer, the term of this patent is extended or adjusted under 35 U.S.C. 154(b) by 0 days.

(21) Appl. No.: 09/386,652

(22) Filed: Aug. 31, 1999

(30) Foreign Application Priority Data

Sep. 3, 1998 (JP) .......................................... 10-250104

(51) Int. Cl.[7] ........................ G01R 25/00; G01R 23/00; G01R 23/14; G01R 23/165
(52) U.S. Cl. .............................. 324/76.78; 324/76.19; 324/76.23; 324/76.29; 324/76.55; 324/76.82
(58) Field of Search ................................. 324/601, 650, 324/638, 76.78, 76.19, 76.23, 76.29, 76.55, 76.82; 455/192.2; 375/235

(56) References Cited

U.S. PATENT DOCUMENTS 3,932,818 A * 1/1976 Masak ........................ 708/322
4,122,448 A * 10/1978 Martin ........................ 342/174

(List continued on next page.)

FOREIGN PATENT DOCUMENTS

| DE | 197 50 349 | 5/1998 |
| EP | 0 501 740 | 9/1992 |

OTHER PUBLICATIONS

Patent Abstracts of Japan, Publication No. 09247225, Sep. 19, 1997.

*Primary Examiner*—Glenn W. Brown
*Assistant Examiner*—Wasseem H. Hamdan
(74) *Attorney, Agent, or Firm*—Smith-Hill and Bedell

(57) ABSTRACT

The present invention provides a wide band IQ splitting apparatus suitable for using in a spectrum analyzer. A quadrature oscillator 30 generates a pair of quadrature signals. An amplitude and phase adjuster 32 receives the quadrature signals and adjusts the balances of the amplitude and the phase between them. An analog splitter 20 mixes an analog IF signal with the pair of quadrature signals for splitting the analog IF signal into analog I and Q signals. First and second analog to digital converters 22 and 24 convert the analog I and Q signals into digital I and Q signals, respectively. A control and processing circuit detects the imbalances of the amplitude and phase between the digital I and Q signals for controlling the amplitude and phase adjuster 32. The amplitude and phase adjuster 32 is previously calibrated. For this first calibration, the analog splitter 20 receives a first calibration signal instead of the analog IF signal. The first calibration signal has a known amplitude and a known frequency slightly different from the frequency of the quadrature signals. Then the control and processing circuit 26 detects the imbalance of the amplitude and/or the phase of the digital I and Q signals and controls the amplitude and phase adjuster 32 properly. The control and processing circuit 26 also produces compensation data. The analog splitter 20 receives a second calibration signal instead of the analog input signal. The frequency of the second calibration signal varies within the band of the analog IF signal. The control and processing circuit 26 calculates the compensation data at a plurality of the frequencies of the calibration signal and a memory stores the compensation data. The compensation data are used to produce compensated frequency domain data, and then compensated time domain data are made from the compensated frequency domain data.

20 Claims, 5 Drawing Sheets

U.S. PATENT DOCUMENTS

| | | | | |
|---|---|---|---|---|
| 4,218,680 A | * | 8/1980 | Kennedy | 342/51 |
| 4,866,395 A | * | 9/1989 | Hostetter | 329/309 |
| 4,981,359 A | * | 1/1991 | Tazartes et al. | 356/459 |
| 4,992,736 A | * | 2/1991 | Stormont et al. | 324/309 |
| 5,046,133 A | * | 9/1991 | Watanabe et al. | 455/138 |
| 5,117,377 A | * | 5/1992 | Finman | 703/2 |
| 5,140,699 A | * | 8/1992 | Kozak | 455/84 |
| 5,249,203 A | * | 9/1993 | Loper | 375/344 |
| 5,293,406 A | * | 3/1994 | Suzuki | 375/295 |
| 5,428,831 A | * | 6/1995 | Monzello et al. | 455/296 |
| 5,696,794 A | * | 12/1997 | O'Dea | 375/296 |
| 5,732,339 A | * | 3/1998 | Auvray et al. | 455/192.2 |
| 5,847,619 A | * | 12/1998 | Kirisawa | 332/103 |
| 5,949,821 A | * | 9/1999 | Emami et al. | 375/235 |
| 6,009,317 A | * | 12/1999 | Wynn | 455/296 |

\* cited by examiner

WIDE BAND IQ SPLITTING APPARATUS AND CALIBRATION METHOD THEREFOR WITH BALANCED AMPLITUDE AND PHASE BETWEEN I AND Q

FIELD OF THE INVENTION

The present invention relates to a wide band I (Inphase) and Q (Quadrature) splitting apparatus, especially, to a wide band IQ splitting apparatus suitable for application in frequency domain analysis, and to a calibration method for the wide band IQ splitting apparatus.

BACKGROUND OF THE INVENTION

A spectrum analyzer is used for analyzing the frequency domain of a signal under test. The spectrum analyzer often has an IQ splitter for getting the frequency domain data. There are two types of IQ splitters, i.e., digital and analog types.

FIG. 1 shows a block diagram of a conventional digital IQ splitter. A frequency converter (not shown) which has a mixer and a local oscillator etc. converts an input signal under test to an intermediate frequency (IF) signal. An analog to digital converter (ADC) 10 converts the analog IF signal into a digital signal. A digital IQ splitter 12 splits the digital signal from the ADC 10 into a digital I (In-phase) signal and a digital Q (Quadrature) signal. The I and Q signals are the components of the IF signal having a phase difference of 90 degrees. A digital signal processor (DSP) 14 transforms the digital I and Q signals into the frequency domain data by the FFT (Fast Fourier Transform) process. A memory 16 stores the data from the DSP 14, which are used to display the signal analysis result in the frequency domain on a suitable display (not shown), such as a CRT or a liquid crystal display.

The conventional configuration described above is satisfactory for relatively narrow band signal analysis but causes some problems if it is used for a wider band signal analysis. The sampling theorem states that the sampling frequency in the analog to digital conversion must be at least twice the maximum frequency of the analog input signal. In the case of wider band analysis, the maximum frequency of the IF signal is higher than in the case of narrow band analysis so that the sampling theorem requires that the sampling frequency of the ADC should be higher. Besides, the frequency domain analysis generally requires higher dynamic range, such as 12 or more bits, than the time domain analysis does, such as 8 bits at most. This also makes it difficult to make the sampling frequency of the ADC higher in the frequency domain analysis. The higher sampling frequency of the ADC leads to a higher data transfer rate and a need for higher operation speeds of the following devices, such as the DSP and the memory. As described, the wider band signal analysis brings technical and economical problems.

One solution of the above problem is to use an analog IQ splitter as shown in FIG. 2. A quadrature oscillator 17 generates a pair of quadrature signals, or sine and cosine signals which have the same frequency and amplitude and a phase difference of 90°. An analog IQ splitter 18 mixes an analog IF signal with the quadrature signals to split the analog IF signal into analog I and Q signals. The I signal is Input(t)*cos(bt) and the Q signal is Input(t)*sin(bt) where Input(t) is the input signal. ADCs 11 and 13 convert the analog I and Q signals into the digital I and Q signals, respectively.

FIG. 3 shows a schematic block diagram of the analog IQ splitter. A quadrature mixer 21 mixes the pair of quadrature signals with the analog IF signal to produce the analog I and Q signals. The frequency of the quadrature signals from the quadrature oscillator 17 is the same as the center frequency of the band of the analog signal. For example, if the band of the analog IF signal is from 35 MHz to 65 MHz (the bandwidth is 30 MHz, the center frequency is 50 MHz), the frequency of the quadrature signals from the quadrature oscillator 17 is 50 MHz. The analog I and Q signals pass low pass filters (LPFs) 23 and 25 to have suitable bandwidths, respectively. In this operation, the bandwidths of the analog I and Q signals are reduced to approximately half, respectively. This is, for example, shown as the following equations:

$$\text{Input}(t) = C \cdot \sin(at)$$

Input(t) is a simple example of an analog IF signal, C is a constant and a varies from 35 MHz to 65 MHz $$\begin{aligned}
I(t) &= \text{Input}(t) * \cos(bt) \\
&= C * \sin(at)\cos(bt) \\
&= (C/2) * [\sin\{(a+b)t\} + \sin\{(a-b)t\}] \\
&= (C/2) * \sin\{(a-b)t\}
\end{aligned}$$

I(t) is the analog IF signal and b is 50 MHz. The term in sin(a+b)t is deleted by the low pass filter.

$$\begin{aligned}
Q(t) &= \text{Input}(t) * \sin(bt) \\
&= C * \sin(at)\sin(bt) \\
&= (C/2) * [\cos\{(a-b)t\} + \cos\{(a+b)t\}] \\
&= (C/2) * \cos\{(a-b)t\}
\end{aligned}$$

Q(t) is the analog Q signal. The term in cos(a+b)t is deleted by the low pass filter.

As shown in the above equations, the LPFs pass the components having "a–b" which varies from –15 MHz to 15 MHz. This means that the frequencies of the output signals of the mixer 21 are from about 0 Hz to about 15 MHz. Therefore the cut-off frequencies of the LPFs 23 and 25 can be about 16 MHz. This reduces the demands of the higher sampling frequency of the ADC and the higher operation speeds of the following devices, such as the DSP 14 and the memory 16.

The use of the analog IQ splitter, however, introduces another problem, namely that it is difficult to keep the amplitude and the phase of the analog I and Q signals in balance. It comes from the difficulty of making the characteristics of the analog I and Q signal paths the same, especially the LPFs. This problem becomes worse when the bandwidth of the analog IF signal is wider. One of the factors is the group delay as shown in FIG. 4. In other words, the propagation speed of the signal in the signal path is different according to the frequency. Generally speaking, the propagation delay increases as frequency increases and the increase of delay with frequency is non-linear. Therefore the digital IQ splitter is better only from the viewpoint of keeping the amplitude and the phase of the I and Q signals in balance. Therefore what is desired is to provide a wide band IQ splitting apparatus suitable for splitting a wide band analog input signal into I and Q signals with balanced amplitude and phase between them. What is further desired is to provide a calibration method for the wide band IQ splitting apparatus.

SUMMARY OF THE INVENTION

The present invention provides a wide band IQ splitting apparatus for splitting an analog input signal into analog I (In-phase) and Q (Quadrature) signals while keeping the amplitude and the phase of the I and Q signals in balance. A quadrature oscillator generates a pair of quadrature signals. An amplitude and phase adjuster receives the quadrature signals and adjusts the balances of the amplitude and the phase between them. An analog splitter mixes an analog input signal with the pair of quadrature signals for splitting the analog input signal into analog I and Q signals. First and second analog to digital converters convert the analog I and Q signals into digital I and Q signals, respectively. A processor detects imbalance of the amplitude and phase between the digital I and Q signals and controls the amplitude and phase adjuster.

The amplitude and phase adjuster is previously calibrated. For this first calibration, the analog splitter receives a first calibration signal instead of the analog input signal. The first calibration signal has a known amplitude and a known frequency slightly different from the frequency of the quadrature signals. Then the processor detects imbalance of the amplitude and/or the phase between the digital I and Q signals for controlling the amplitude and phase adjuster properly. The frequency difference between the frequency of the first calibration signal and that of the quadrature signal is small enough that the group delay can be neglected and large enough that the processor can detect the frequency difference.

The processor according to the present invention produces compensation data in a second calibration. For the second calibration, the analog splitter receives a second calibration signal instead of the analog input signal. The frequency of the second calibration signal varies within the band of the analog input signal and the processor calculates compensation data at a plurality of frequencies of the calibration signal and a memory stores the compensation data. The frequency of the second calibration signal can vary step by step, or by a increment or a decrement. The amount by which the frequency changes in each step is small enough that the group delay can be neglected and large enough that the processor can detect the difference. The processor can calculate compensated frequency domain data from the digital I and Q data by using the compensation data and can calculate time domain data from the compensated frequency domain data.

The amplitude and phase adjuster can include a variable phase controller and a gain variable amplifier. The variable phase controller controls the phase of one of the quadrature signals. The gain variable amplifier controls the gain of one of the quadrature signals. The analog IQ splitter can have a mixer and a pair of low pass filters. The mixer mixes the analog input signal with the pair of quadrature signals. The low pass filters receive the output signals of the mixer and suitably limit the bandwidths of the analog I and Q signals. In this case, the frequency of the quadrature signals is approximately equal to the center frequency of the band of the analog input signal.

DESCRIPTION OF PREFERRED EMBODIMENTS OF THE INVENTION

Figure 1:
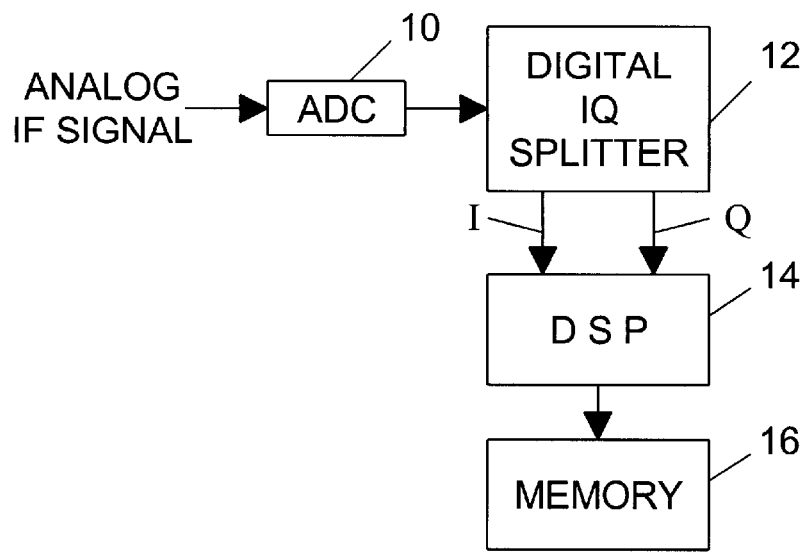
FIG. 1 shows a schematic block diagram of a conventional digital IQ splitter.
Figure 2:
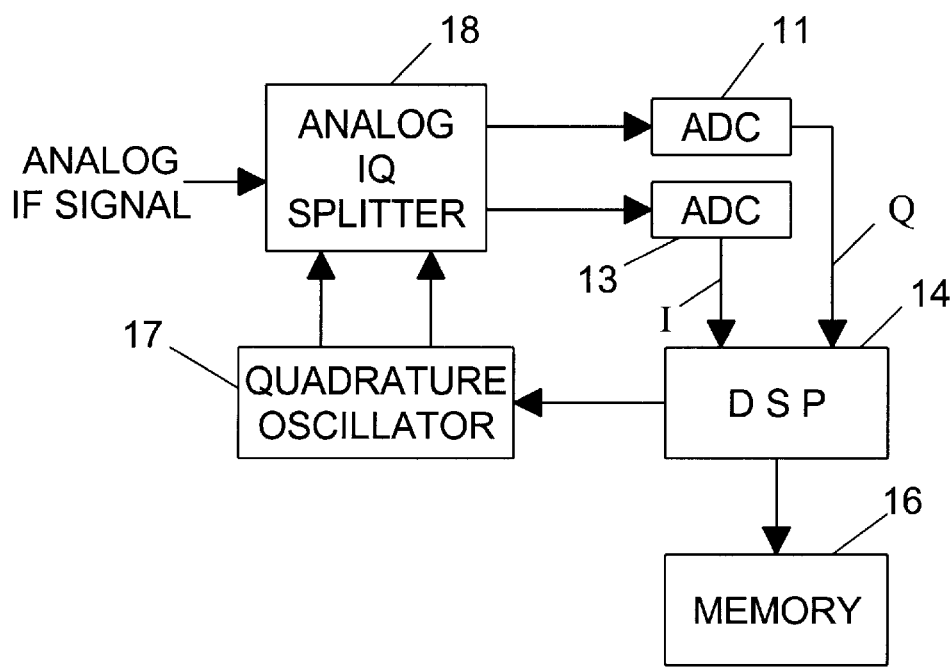
FIG. 2 shows a schematic diagram of a conventional analog IQ splitter.
Figure 3:
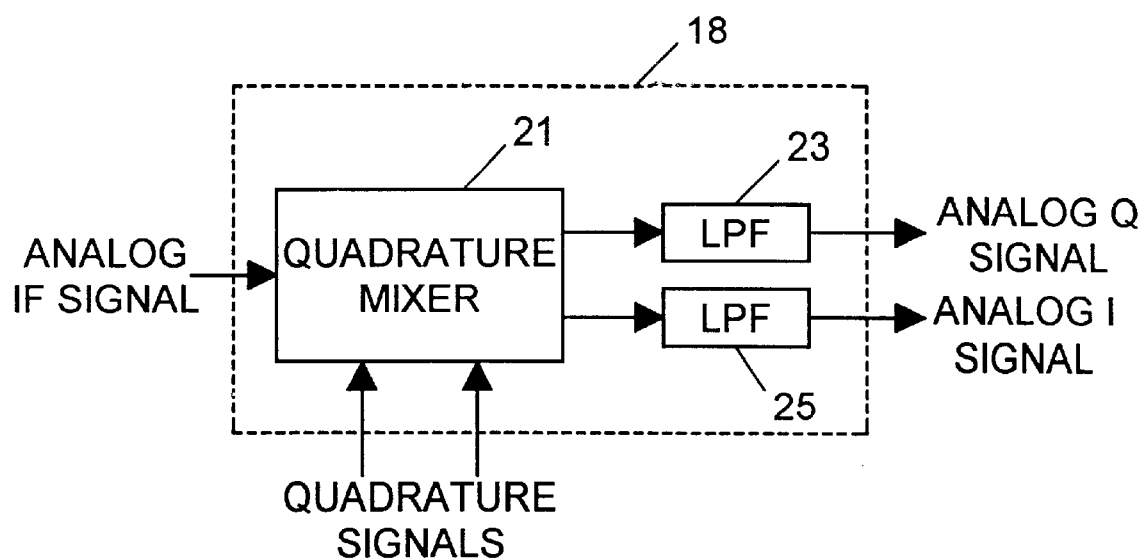
FIG. 3 shows a schematic diagram of one embodiment of an analog IQ splitter.
Figure 4:
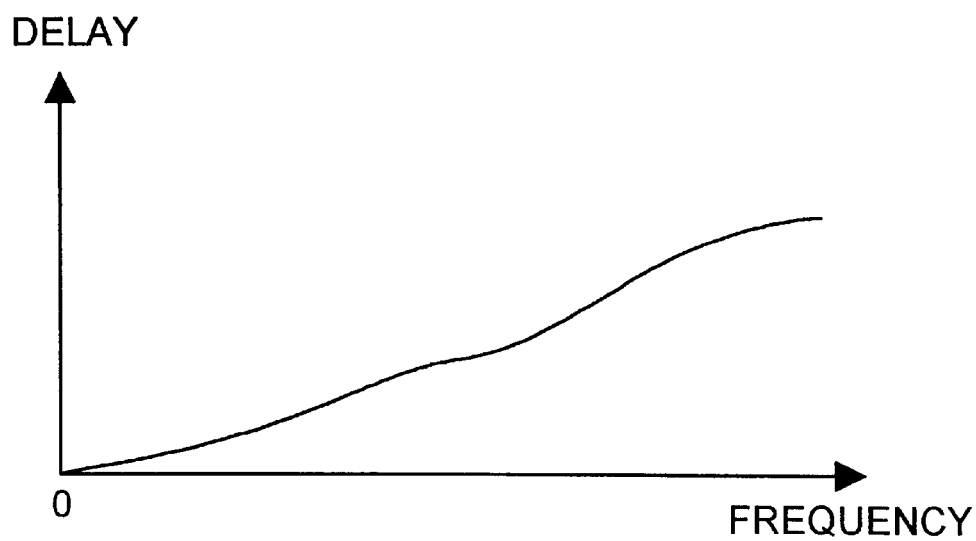
FIG. 4 is a graph of showing characteristics of the group delay.
Figure 5:
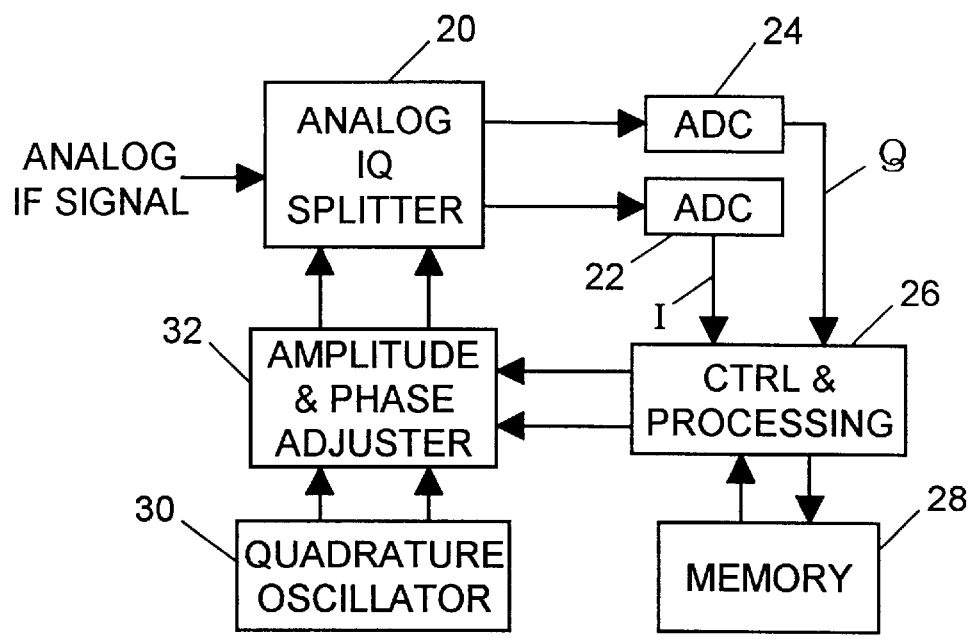
FIG. 5 shows a schematic diagram of one embodiment of a wide band IQ splitting apparatus according to the present invention.

FIG. 5 shows a schematic block diagram of one preferred embodiment according to the present invention. A frequency converter (not shown) which has a mixer and a local oscillator etc. converts a signal under test to an intermediate frequency (IF) signal. For example, the input signal might have a frequency of 3 GHz and the frequency converter down converts the frequency of the input signal to generate an IF signal having a frequency within a predetermined band (e.g. from 35 MHz to 65 MHz). A quadrature oscillator 30 supplies a pair of quadrature signals, or sine and cosine signals of which the phase and amplitude are adjusted as described below, and an analog IQ splitter 20 multiplies the analog IF signal by the pair of quadrature signals and provides analog I (In-phase) and Q (Quadrature) signals. Analog to digital converters (ADCs) 22 and 24 convert the analog I and Q signals into digital I and Q signals, respectively. A control and processing circuit 26 transforms the digital I and Q signals into frequency domain data by the FFT process. The digital I and Q signals constitute the real and imaginary components respectively of the frequency domain data. A memory 28 stores the frequency domain data. The memory 28 is connected to a bus of a microprocessor system (not shown) including a CPU, a hard disk (magnetic disk) etc. The data in the memory 28 are used for displaying the measurement result on a CRT etc. or for other analysis.

Figure 6:
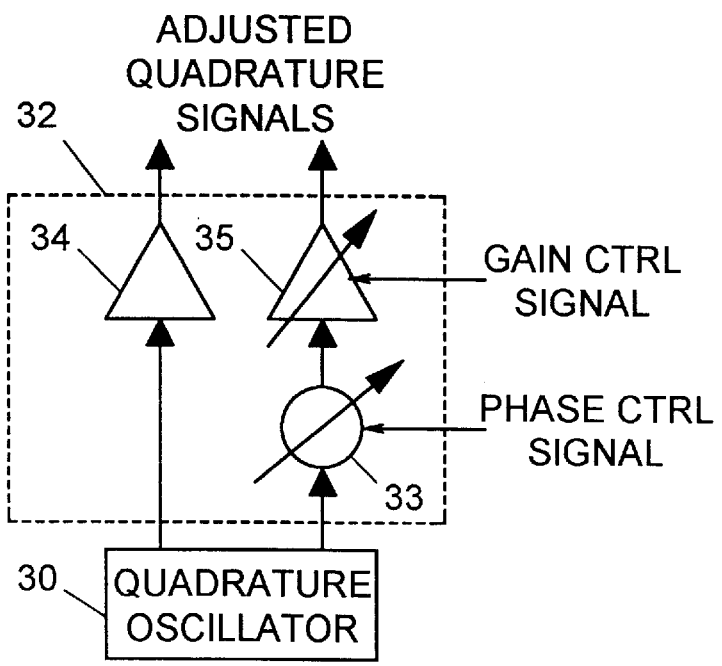
FIG. 6 shows a schematic diagram of one embodiment of an amplitude and phase adjuster according to the present invention.

An amplitude and phase adjuster 32 adjusts the balances of the amplitude and the phase between the pair of quadrature signals from the quadrature oscillator 30. FIG. 6 shows a schematic block diagram of one preferred embodiment of the amplitude and phase adjuster 32. An amplifier 34 amplifies one of the quadrature signals from the quadrature oscillator 30. The other of the quadrature signals passes through a variable phase controller 33 and a variable gain amplifier 35 which are controlled respectively by a phase control signal and gain control signal from the control and processing circuit 26. The amplitude and phase adjuster 32 provides the adjusted quadrature signals to the analog IQ splitter 20 for producing the analog I and Q signals of which balances of the amplitude and the phase are adjusted.

Figure 7:
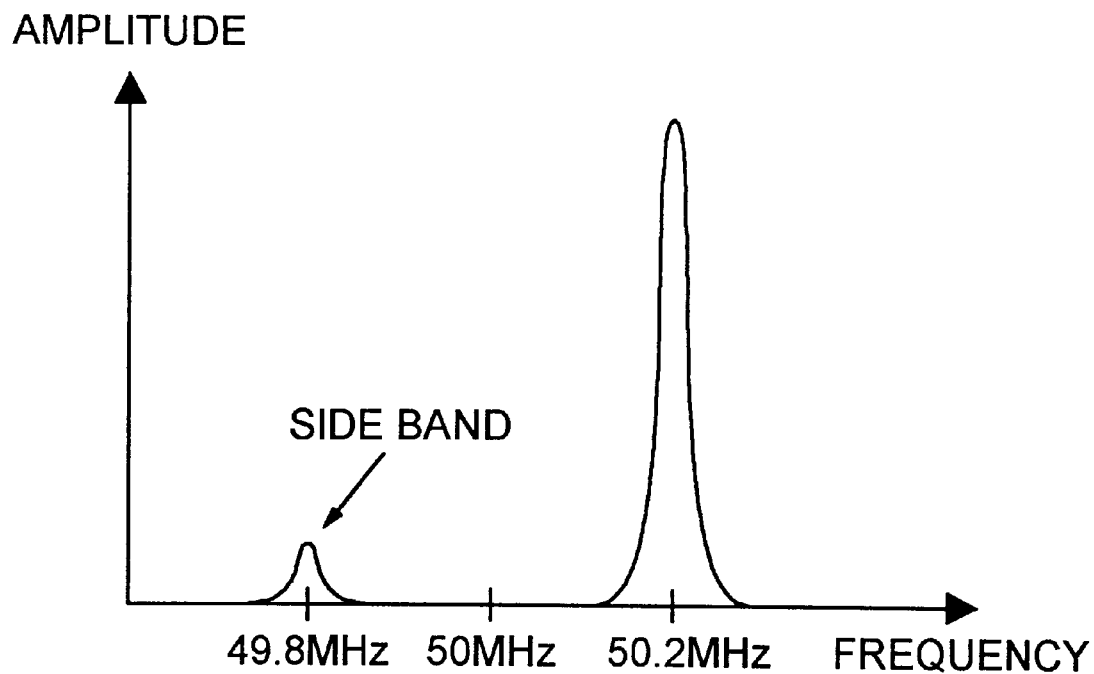
FIG. 7 is a graph explaining a side band generation in the first calibration according to the present invention.

For the suitable adjustment, the amplitude and phase adjuster 32 is previously calibrated. This calibration (called the first calibration below) is based on the center frequency of the analog IF signal band. For the first calibration, the analog IQ splitter 20 receives a first calibration signal of which amplitude, phase and frequency are known. The first calibration signal may be provided by a signal generator (not shown). The frequency of the first calibration signal is slightly different from the center frequency of the analog IF signal band. For example, if the band of the analog IF signal is from 35 MHz to 65 MHz (the center frequency 50 MHz), the frequency of the calibration signal might be 50.2 MHz (200 kHz difference). The analog IQ splitter 20 multiplies the first calibration signal by the quadrature signals of which the frequencies are 50 MHz. Referring to FIG. 7, if the amplitude and phase adjuster 32 is not properly adjusted, and the quadrature signals supplied to the analog IQ splitter are not balanced in phase and amplitude, the I and Q signals received by the control and processing circuit 26 are not balanced and a side band appears at 49.8 MHz after the FFT process. Then the control and processing circuit 26 adjusts the gain and phase control signals in order to eliminate the side band. When the gain and phase control signals are such that the side band is eliminated, the first calibration is complete.

The difference dF between the center frequency of the band and the frequency of the first calibration signal should be small enough that the group delay of the signal paths from the analog IQ splitter 20 to the control and processing circuit 26 can be neglected. The frequency difference dF, however, should be large enough that the control and processing circuit 26 can detect the side band. Though the example described above uses a frequency difference dF of 200 kHz, it can be another value according to the measurement resolution.

The first calibration concerning the amplitude and phase adjuster 32 makes the amplitude and phase balances of the analog I and Q signals suitable if the frequency of the input analog IF signal is approximately equal to the center frequency of the band. The analog IF signal, however, has a wider band. Therefore another calibration is necessary for the control and processing circuit 26 to get balance compensated data of the analog I and Q signals throughout the band. This second calibration is usually conducted following the first calibration. However, if the adjuster 32 has no problem and the I and Q signals received by the control and processing circuit 26 are balanced in amplitude and phase when the analog IQ splitter receives the first calibration signal, the second calibration can be done without the first calibration.

Figure 9:
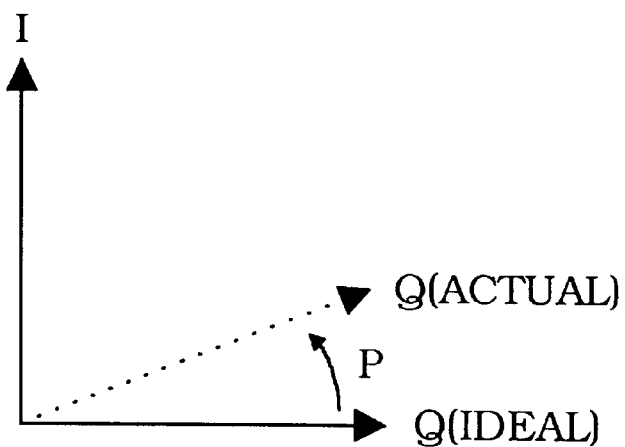
FIG. 9 shows a phase shift of P radian from the ideal relationship between the I and Q signals.
Figure 8:
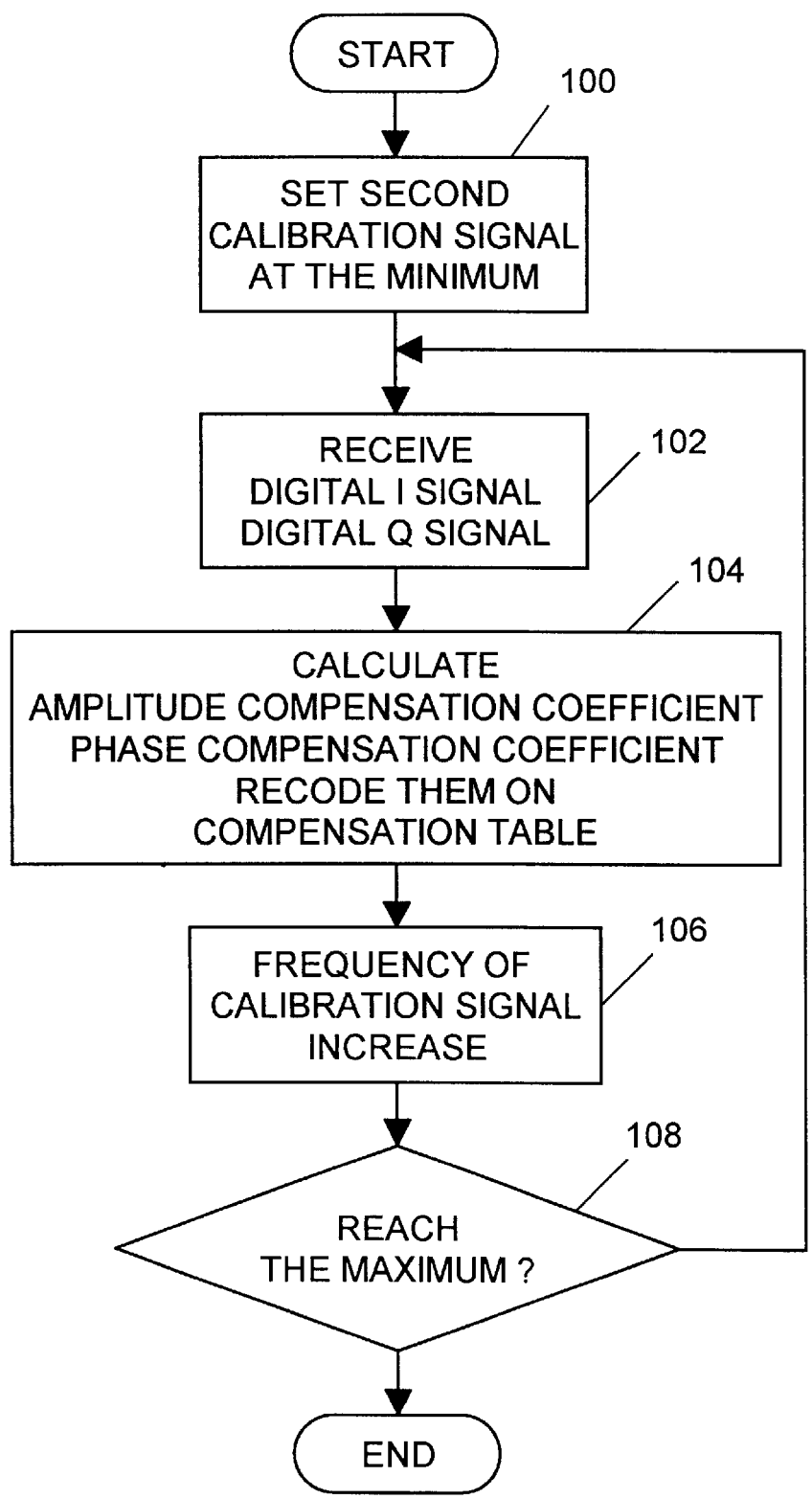
FIG. 8 shows a flow chart of one embodiment of the second calibration according to the present invention.

FIG. 8 shows a flow chart of one preferred embodiment according to the second calibration of the present invention. The second calibration produces a compensation table recording compensation data throughout the band. The analog IQ splitter 20 receives a second calibration signal which has known amplitude, phase and single frequency instead of the analog IF signal. The second calibration signal may be provided by a signal generator (not shown). In the second calibration, the second calibration signal is set to the minimum frequency of the analog IF signal band at first (step 100). For example, if the band of the analog IF signal is from 35 MHz to 65 MHz, the frequency of the calibration signal is set to 35 MHz at first. At step 102, the control and processing circuit 26 receives the digital I and Q signals. The digital I and Q signals are represented as data sequences a(n) and b(n), respectively, wherein the "n" means a sampling number in the ADCs 22 and 24. The control and processing circuit 26 calculates amplitudes Ma and Mb of the digital I and Q signals from the data sequences and produces an amplitude compensation coefficient K=Ma/Mb. At the same time, a phase compensation coefficient P at the minimum frequency is calculated by the following equation:

P=−0.001953*S/(Ma*Mb)

wherein S={(a(n)−Da)*(b(n)−Db)}
 Da: average of a(n)
 Db: average of b(n)
 Unit of P is radian The P means a phase shift from the ideal relationship between the I and Q signals, or 90 degrees as shown in FIG. 9. The memory 28 stores the amplitude and phase coefficients K and P of the compensation table at the minimum frequency (step 104). After the step 104, the frequency of the second calibration signal is increased by some amount (step 106). This increment of the frequency of the calibration signal is, for example, 200 kHz. The amount of the increment should be small enough that the group delay can be neglected and large enough for the control and processing circuit 26 to detect the difference. The control and processing circuit 26 repetitively calculates the amplitude and phase compensation coefficients K and P at each frequency until it reaches the maximum frequency (e.g. 65 MHz) of the analog IF signal band (step 108). At this point, the compensation table is complete.

The control and processing circuit 26 compensates the frequency domain data derived from the I and Q signals using the compensation table. For compensating the amplitude and phase shift, it uses the following equations:

Ac=K*(A*cos(P)−B*sin(P))

Bc=K*(B*cos(P)+A*sin(P))

wherein A: Real part of the frequency data
 B: Imaginary part of the frequency data
 Ac: Compensated real part of the frequency data
 Bc: Compensated imaginary part of the frequency data The above equations apply an angular rotation or phase shift to the frequency domain data according to the value of P and an amplitude compensation according to the value of K for each frequency of the input analog IF signal. By the way, the A and B are calculated from the digital I and Q signals by the FFT process of the control and processing circuit 26, or they are actual and non-compensated frequency domain data. If the time domain data are necessary, they are calculated from the corresponding compensated frequency domain data by the inverse-FFT process so that the time domain data are also compensated concerning the amplitude and phase balances. The memory 28 stores the frequency domain data and the time domain data and records the time correspondence between them. The data in the memory 28 are transferred via a bus of a microprocessor system including a CPU, a hard disk etc. and used for displaying the data or another analysis.

It will also be apparent to those skilled in the art that there are additional embodiments which are not described above but which are clearly within the scope and principle of the present invention. For example, in the second calibration, the initial frequency of the calibration signal need not be the minimum frequency and could instead be the maximum frequency. Further, the frequency of the second calibration signal need not vary in increments or decrements (or step by step), but may be at random or interlaced. It is important to obtain compensation data at a sufficient number of frequencies of the second calibration signal. Though the analog IQ splitter 20 receives the analog IF signal in the above embodiment, it can be any analog input signal with a predetermined band. The control and processing circuit could detect imbalance of amplitude and phase in the first calibration using the same equations as in the second calibration, but it is better for fine calibration of the amplitude and phase adjuster to use frequency domain data, for example by detecting a side band as described with reference to FIG. 7.

What is claim is:

1. A wide band IQ splitting apparatus comprising:
 a quadrature oscillator for generating a pair of quadrature signals, an analog IQ splitter including a mixer for mixing an analog input signal with the pair of quadrature signals for splitting the analog input signal into analog I and Q signals of which bandwidths are reduced to approximately half relative to that of the analog input signal before analog to digital conversion, an amplitude and phase adjuster for adjusting relative amplitude and relative phase of the pair of quadrature signals in order to adjust imbalance of the amplitude and the phase of the analog I and Q signals from the analog IQ splitter, a first analog to digital converter for converting the analog I signal of which the bandwidth is approximately the half bandwidth of the analog input signal into a digital I signal, a second analog to digital converter for converting the analog Q signal of which the bandwidth is approximately the half bandwidth of the analog input signal into a digital Q signal, and a processor for receiving the digital I and Q signals and for compensating imbalance of amplitude and phase between the digital I and Q signals by using compensation data.

2. A wide band IQ splitting apparatus according to claim 1, wherein the amplitude and phase adjuster is previously calibrated by providing a first calibration signal to the analog IQ splitter, the first calibration signal having a known amplitude and having a known frequency slightly different from the frequency of the quadrature signals so that the processor controls the amplitude and phase adjuster to adjust the balance of amplitude and phase between the quadrature signals.

3. A wide band IQ splitting apparatus according to claim 2, wherein the frequency difference between the frequency of the first calibration signal and the frequency of the quadrature signals is small enough that group delay can be neglected and large enough for the processor to detect the frequency difference.

4. A wide band IQ splitting apparatus according to claim 2, wherein the processor transforms digital I and Q signals derived from the first calibration signal into frequency domain data, and controls the amplitude and phase adjuster so as to suppress a side band in the frequency domain data.

5. A wide band IQ splitting apparatus according to claim 1, wherein the processor produces the compensation data by providing a calibration signal to the analog IQ splitter and the frequency of the calibration signal varies selectively within the band of the analog input signal and the processor calculates the compensation data at a plurality of frequencies of the calibration signal and stores the compensation data in a memory.

6. A wide band IQ splitting apparatus according to claim 5, wherein the frequency of the calibration signal varies step-by-step, and each step is small enough that group delay can be neglected and large enough that the processor can detect the frequency difference.

7. A wide band IQ splitting apparatus according to claim 5, wherein the processor calculates compensated frequency domain data from the digital I and Q data by using the compensation data, and calculates time domain data from the compensated frequency domain data.

8. A wide band IQ splitting apparatus according to claim 1, wherein the amplitude and phase adjuster has a variable phase controller for controlling the phase of one of the quadrature signals and a gain variable amplifier for controlling the gain of one of the quadrature signals.

9. A wide band IQ splitting apparatus according to claim 1, wherein the analog IQ splitter includes a pair of low pass filters for receiving the output signals of the mixer to limit bandwidth of the analog I and Q signals.

10. A wide band IQ splitting apparatus according to claim 1, wherein the quadrature signals have a frequency approximately equal to the center frequency of the band of the analog input signal.

11. A wide band IQ splitting apparatus according to claim 1, wherein it is used in a spectrum analyzer and the analog input signal is an analog intermediate frequency signal having a predetermined band.

12. A calibration method for the wide band IQ splitting apparatus according to claim 1, comprising the steps of:

providing a first calibration signal to the analog IQ splitter, the first calibration signal having a known amplitude and a known frequency slightly different from the frequency of the pair of quadrature signals, splitting the first calibration signal into analog I and Q signals, digitizing the analog I and Q signals to digital I and Q signals, detecting imbalance of the amplitude and the phase between the digital I and Q signals derived from the first calibration signal, and controlling the amplitude and phase adjuster to adjust relative amplitude and relative phase of the pair of quadrature signals to correct the imbalance of the amplitude and phase between the digital I and Q signals.

13. A calibration method according to claim 12, wherein the frequency difference between the frequency of the first calibration signal and the frequency of the quadrature signals is small enough that group delay can be neglected and large enough for the processor to detect the frequency difference.

14. A calibration method according to claim 12, wherein the detecting and controlling steps have steps of transforming the digital I and Q signals into frequency domain data, detecting a side band in the frequency domain data, and controlling the amplitude and phase adjuster so as to suppress the side band.

15. A calibration method according to claim 12, further comprising steps of:

providing a second calibration signal to the analog IQ splitter, the second calibration signal having a known amplitude and a known frequency, splitting the second calibration signal into analog I and Q signals, digitizing the analog I and Q signals to digital I and Q signals, calculating the compensation data at the frequency of the second calibration signal from the digital I and Q signals derived from the second calibration signal, storing the compensation data in a memory, varying the frequency of the second calibration signal selectively within the band of the analog input signal until sufficient compensation data are acquired.

16. A calibration method according to claim 15, wherein the second calibration signal has an initial frequency at one end of the band of the analog input signal, and the varying step comprises varying the frequency of the second calibration signal step-by-step until the frequency of the second calibration signal reaches the other end of the band of the analog input signal.

17. A calibration method according to claim 16, wherein each frequency step of the second calibration signal is small enough that group delay can be neglected and large enough that the processor can detect the frequency difference.

18. A calibration method for the wide band IQ splitting apparatus according to claim 1, comprising steps of:

provdiing a calibration signal to the analog IQ splitter, the calibration signal having a known amplitude and a known frequency, splitting the calibration signal into analog I and Q signals, digitizing the analog I and Q signals to digital I and Q signals, calculating the compensation data at the frequency of the calibration signal from the digital I and Q signals derived from the calibration signal, storing the compensation data in a memory, varying the frequency of the calibration signal selectively within the band of the analog input signal until sufficient compensation data are acquired.

19. A calibration method for the wide band IQ splitting apparatus according to claim 1, comprising steps of:

providing a calibration signal to the analog IQ splitter, the calibration signal having a known amplitude and a known frequency of one end of the band of the analog input signal, splitting the calibration signal into analog I and Q signals, digitizing the analog I and Q signals to digital I and Q signals, calculating the compensation data at the frequency of the calibration signal from the digital I and Q signals derived from the calibration signal, storing the compensation data in a memory, varying the frequency of the calibration signal step-by-step until the frequency of the calibration signal reaches the other end of the band of the analog input signal.

20. A calibration method according to claim 19, wherein each frequency step of the second calibration signal is small enough that group delay can be neglected and large enough that the processor can detect the frequency difference.

* * * * *